United States Patent
Zhang et al.

(10) Patent No.: US 9,768,740 B2
(45) Date of Patent: Sep. 19, 2017

(54) FEEDBACK COMPENSATION FOR MULTISTAGE AMPLIFIERS

(71) Applicant: SKYWORKS SOLUTIONS, INC., Woburn, MA (US)

(72) Inventors: Xu Zhang, Ames, IA (US); Gregory A. Blum, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/011,635

(22) Filed: Jan. 31, 2016

(65) Prior Publication Data

US 2017/0026007 A1  Jan. 26, 2017

Related U.S. Application Data

(60) Provisional application No. 62/110,881, filed on Feb. 2, 2015.

(51) Int. Cl.
| | |
|---|---|
| *H03F 1/34* | (2006.01) |
| *H03F 1/48* | (2006.01) |
| *H03F 3/195* | (2006.01) |
| *H03F 3/45* | (2006.01) |
| *H03F 3/24* | (2006.01) |

(52) U.S. Cl.
CPC ............ *H03F 1/483* (2013.01); *H03F 3/195* (2013.01); *H03F 3/245* (2013.01); *H03F 3/45192* (2013.01); *H03F 3/45475* (2013.01); *H03F 2200/36* (2013.01); *H03F 2200/408* (2013.01); *H03F 2200/451* (2013.01)

(58) Field of Classification Search
CPC . H03F 1/22; H03F 1/223; H03F 1/226; H03F 1/42; H03F 3/68
USPC ........ 330/85, 86, 98, 99, 100, 107, 109, 311
See application file for complete search history.

(56) References Cited

U.S. PATENT DOCUMENTS

| | | | |
|---|---|---|---|
| 6,825,725 B1 * | 11/2004 | Doherty | H03F 1/0233 330/278 |
| 8,847,678 B2 * | 9/2014 | Chen | G05F 1/575 323/280 |

* cited by examiner

*Primary Examiner* — Steven J Mottola
(74) *Attorney, Agent, or Firm* — Chang & Hale LLP

(57) ABSTRACT

Feedback compensation for multistage amplifiers. In some embodiments, an amplifier can include a first stage, a second stage, and a third stage implemented in series between an input node and an output node. The amplifier can further include a first feedback path implemented between an output of the third stage and a node between the first and second stages, with the first feedback including a first capacitance. The amplifier can further include a second feedback path implemented between the output of the third stage and an output of the second stage. The second feedback pack can include a transconductance element and a second capacitance arranged in series. In some embodiments, such an amplifier can be configured as an operational-amplifier.

19 Claims, 6 Drawing Sheets

FEEDBACK COMPENSATION FOR MULTISTAGE AMPLIFIERS

CROSS-REFERENCE TO RELATED APPLICATION(S)

This application claims priority to U.S. Provisional Application No. 62/110,881 filed Feb. 2, 2015, entitled CASCODE AND TRANSCONDUCTANCE WITH CAPACITANCES FEEDBACK COMPENSATION FOR MULTISTAGE AMPLIFIERS, the disclosure of which is hereby expressly incorporated by reference herein in its entirety.

BACKGROUND

Field

The present disclosure relates to feedback compensation for multistage amplifiers.

Description of the Related Art

In many electronic applications, processing of signals can include use of an amplifier. Such an amplifier can include, for example, an operational-amplifier.

SUMMARY

In accordance with some implementations, the present disclosure relates to an amplifier that includes a first stage, a second stage, and a third stage implemented in series between an input node and an output node. The amplifier further includes a first feedback path implemented between an output of the third stage and a node between the first and second stages, with the first feedback including a first capacitance. The amplifier further includes a second feedback path implemented between the output of the third stage and an output of the second stage. The second feedback path includes a transconductance element and a second capacitance arranged in series.

In some embodiments, the amplifier can further include a cascode transistor implemented between an output of the first stage and an input of the second stage. The first feedback path can include the cascode transistor such that the first feedback path couples the output of the third stage with the input of the second stage. The cascode transistor can include a source connected to the output of the first stage, and a drain connected to the input of the second stage.

In some embodiments, the amplifier can further include a feed-forward element implemented between the input of the second stage and the output of the third stage. The feed-forward element can include a field-effect transistor having a gate connected to the input of the second stage and a drain connected to the output of the third stage.

In some embodiments, the third stage can include a field-effect transistor having a drain connected to the output of the third stage and a gage connected to an input of the third stage. In some embodiments, the input of the third stage can be directly connected to the output of the second stage. In some embodiments, the second feedback path can be configured such that a first terminal of the second capacitance is connected to the drain of the field-effect transistor of the third stage, and a second terminal of the second capacitance is connected to the transconductance element of the second feedback path. In some embodiments, the transconductance element of the second feedback path can include a field-effect transistor having a source connected to the second terminal of the second capacitance, and a drain connected to the output of the second stage.

In some embodiments, each of the first stage, the second stage, and the third stage can include one or more field-effect transistors. In some embodiments, substantially all of the field-effect transistors can be implemented as CMOS devices.

In some embodiments, the amplifier can be configured as an operational-amplifier. The operational-amplifier can be configured to process a signal having a frequency within a radio-frequency (RF) range.

In a number of implementations, the present disclosure relates to a semiconductor die having a semiconductor substrate and an amplifier circuit implemented on the semiconductor substrate. The amplifier circuit includes a first stage, a second stage, and a third stage implemented in series between an input node and an output node. The amplifier circuit further includes a first feedback path implemented between an output of the third stage and a node between the first and second stages, with the first feedback including a first capacitance. The amplifier circuit further includes a second feedback path implemented between the output of the third stage and an output of the second stage. The second feedback path includes a transconductance element and a second capacitance arranged in series.

In some embodiments, each of the first stage, the second stage, and the third stage can include one or more field-effect transistors. The semiconductor substrate can be configured to allow formation of the field-effect transistors as CMOS devices.

In some embodiments, the amplifier circuit can be configured as an operational-amplifier. In some embodiments, the semiconductor die can further include an integrated circuit configured to process one or more signals, and the integrated circuit can be coupled to and configured to utilize the operational-amplifier.

In some teachings, the present disclosure relates to a packaged electronic module having a packaging substrate configured to receive a plurality of components, and a semiconductor die mounted on the packaging substrate. The semiconductor die includes an amplifier circuit having a first stage, a second stage, and a third stage implemented in series between an input node and an output node. The amplifier circuit further includes a first feedback path implemented between an output of the third stage and a node between the first and second stages, with the first feedback including a first capacitance. The amplifier circuit further includes a second feedback path implemented between the output of the third stage and an output of the second stage. The second feedback path includes a transconductance element and a second capacitance arranged in series.

In some implementations, the present disclosure relates to a packaged electronic module having a packaging substrate configured to receive a plurality of components, and an amplifier circuit implemented on the packaging substrate. The amplifier circuit includes a first stage, a second stage, and a third stage implemented in series between an input node and an output node. The amplifier circuit further includes a first feedback path implemented between an output of the third stage and a node between the first and second stages, with the first feedback including a first capacitance. The amplifier circuit further includes a second feedback path implemented between the output of the third stage and an output of the second stage. The second feedback path includes a transconductance element and a second capacitance arranged in series.

In some embodiments, some or all of the amplifier circuit can be implemented on a semiconductor die, and such a die can be mounted on the packaging substrate.

In some implementations, the present disclosure relates to an electronic device having one or more amplifier circuits. Each of the one or more amplifier circuits includes a first stage, a second stage, and a third stage implemented in series between an input node and an output node. The amplifier circuit further includes a first feedback path implemented between an output of the third stage and a node between the first and second stages, with the first feedback including a first capacitance. The amplifier circuit further includes a second feedback path implemented between the output of the third stage and an output of the second stage. The second feedback path includes a transconductance element and a second capacitance arranged in series.

In some embodiments, the electronic device can be, for example, a wireless device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
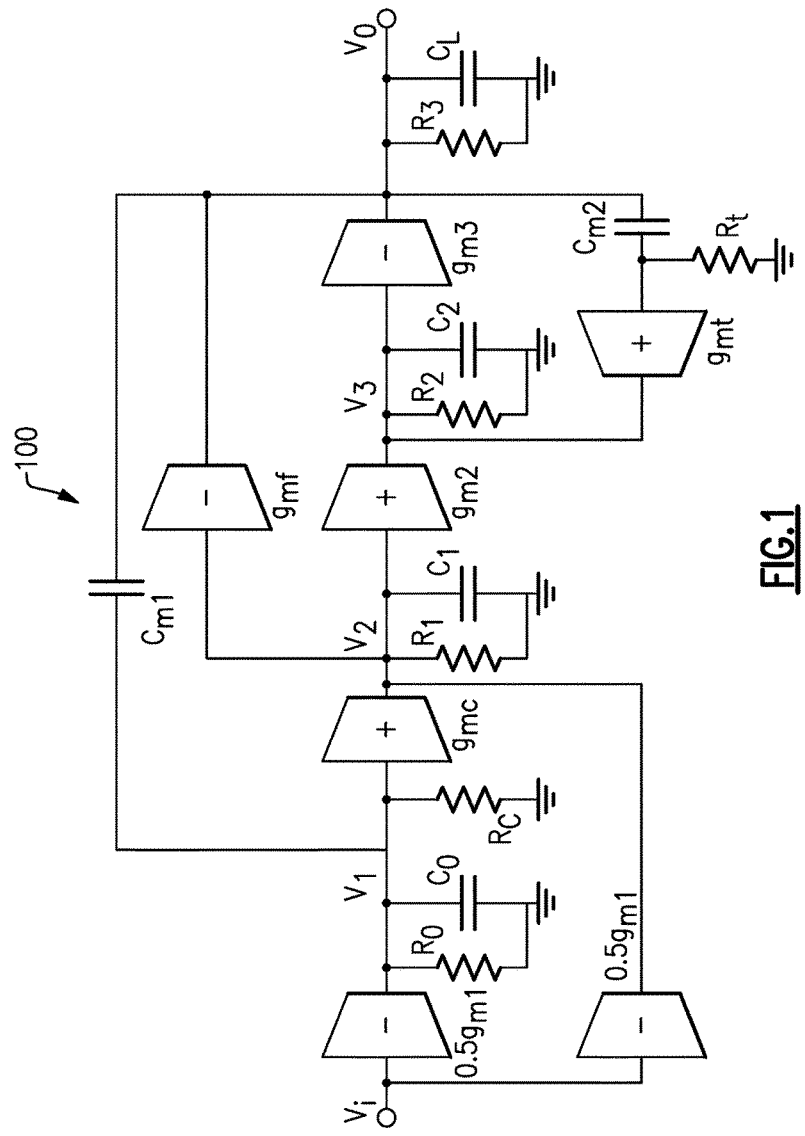
FIG. 1 shows an example amplification system having multiple stages, and a compensation circuit having one more features as described herein.

The headings provided herein, if any, are for convenience only and do not necessarily affect the scope or meaning of the claimed invention.

Disclosed herein are various examples related to circuits, devices and methods involving feedback compensation for multistage amplifiers. For the purpose of description, it will be understood that a multistage amplifier can include two or more amplification stages.

In some embodiments, a feedback compensation circuit can be configured as cascode and transconductance with capacitances feedback compensation (also referred to herein as CTCFC) for multistage amplifiers. By adding a transconductance with capacitor feedback across, for example, an output stage of an amplifier, a shorting effect of the capacitor can be eliminated or reduced, which can enlarge the gain at a higher frequency region. Such a capacitor can also help stabilize a no load configuration. Another compensation capacitor implemented through cascode from an output to a first stage of the amplifier can simplify the compensation circuit and provide one or more zeros to further increase the bandwidth. Various examples related to the foregoing are described herein.

When configured as described herein, an example amplifier implemented in a 0.6 μm CMOS process has demonstrated a number of performance features. For example, a gain-bandwidth product (GBW) has been shown to be approximately 3.6 MHz under a capacitive load of 1 nF. A slew rate of approximately 2.6V/μs and a current consumption of approximately 88 μA have also been demonstrated as yielding an improvement in, for example, a figure of merit performance parameter $IFOM_L$.

Operational amplifiers are important building blocks in modern integrated systems. With high-gain and high-bandwidth characteristics, they are widely used in various circuits such as buffers, filters and data converters. Due the shrinking voltage headroom, conventional methods of cascoding transistors to increase the gain are generally not practical. Instead, cascading stages horizontally is a popular method of gain boosting. However, an increase of pole number due to multiple stages typically generates closed-loop stability problems for the amplifiers.

In some applications, frequency-compensation methods can be utilized to address some or all of the foregoing challenges. For example, nested-Miller compensation (NMC) is a known technique that can be utilized. However, a disadvantage of large compensation capacitors and low gain-bandwidth product typically limits the applicability of such a technique.

In some applications, transconductance with capacitances feedback compensation (TCFC) uses a transconductance stage between a compensation capacitor and the feedback node to avoid self-biasing of an output stage in order to improve the frequency response. However, such a configuration can be affected by another compensation capacitor, similar to foregoing NMC example.

In some applications, active-feedback frequency-compensation (AFFC) technique utilizes a similar method to deal with another compensation capacitance by an extra circuit. However, if implemented without a transconductance with capacitance feedback, such a configuration can suffer from a stability problem for small load conditions.

Described herein are examples related to a cascode and transconductance with capacitances feedback compensation (also referred to herein as CTCFC) technique for an example three-stage amplifier. It will be understood that such an amplifier can be an operational amplifier, an amplifier configured to amplify a radio-frequency (RF) signal, and the like.

With such a CTCFC topology, small compensation capacitors can be implemented to thereby help stabilize the multi-pole system which gives rise to a higher gain-bandwidth product, as well as an ability of driving a no load or large capacitive load with a reasonable slew rate. Various examples of an analysis of the foregoing CTCFC technique are described herein in greater detail. Although the example CTCFC configuration is described in the context of a three-stage amplifier, it will be understood that one or more features of the present disclosure can also be implemented in amplifiers having other numbers of stages.

It is noted that in some implementations, nested Miller compensation (NMC) can include an extension of two-stage Miller compensation. By assuming that gain of each stage is much larger than 1 and $C_L$, $C_{m1,2} \gg C_i$, where $C_i$ is the parasitic capacitance at the output of the i-th stage, $C_L$ is the load capacitance and $C_{m1,2}$ are compensation capacitors, a condition yielding stability can be expressed as $g_{m3}/(4C_L) > 2\pi GBW$, where $g_{m3}$ is the transconductance of the last stage, and GBW is the gain bandwidth.

Then, a large transconductance for the last stage is typically required, which is typically not suited for low-power applications. Accordingly, the foregoing stability condition limits the maximum achievable GBW. With $g_{m1,2}$ being transconductances for the first and second stages, design constraints can be expressed as $C_{m1} = 4g_{m1}/(g_{m3}C_L)$ and $C_{m2} = 2g_{m2}/(g_{m3}C_L)$. With such design constraints, an example phase margin of 60° can be realized. However, the compensation capacitors are typically large and proportional to the load capacitor. Accordingly, use of such compensation capacitors will typically need an increased area, and degradation of slew rate can occur.

It can be seen that the first to output stage compensation capacitor $C_{m1}$ generates one right hand plan (RHP) zero which is typically harmful to phase margin. The second to output compensation $C_{m2}$ typically shorts the connection at high frequency and typically causes an unnecessary gain reduction. If $C_{m2}$ is removed, such limitation can be eliminated or reduced; however, the first non-dominant pole would typically be determined by the parasitic capacitance at the output node of the second stage which is typically very process-sensitive. Accordingly, stability with small $C_L$ is also affected.

Disclosed herein are examples related to a cascode and transconductance with capacitances feedback compensation (CTCFC) circuit. FIG. 1 shows an example amplification system having multiple stages, and also having a CTCFC circuit having one more features as described herein. In some embodiments, by adding a transconductance with capacitance feedback across the last stage ($g_{mt}$-$C_{m2}$ loop in FIG. 1), a shorting effect caused by sole $C_{m2}$ compensation can be prevented. Also, GBW can be increased, and stability can be achieved for no-external-load applications. By introducing a $C_{m1}$ capacitance through a cascode transistor, two left-hand plane (LHP) zeros can be generated to improve the stability performance. In addition, an area needed for such compensation can be small, and the slew rate can be improved due to the small compensation capacitors.

Referring to the example compensation configuration of FIG. 1, $g_{mi}$, $R_i$ and $C_i$ represent transconductance, resistance and capacitance, respectively, of each stage. A ratio $g_{mc}/R_c$ is the transconductance/input-resistance of the cascode transistor, and $g_{mt}/R_t$ is the transconductance/input-resistance for the second compensation feed-back ($g_{mt}$-$C_{m2}$) loop. The two example compensation capacitors are represented by $C_{m1}$ and $C_{m2}$. $C_L$ is the load capacitance.

In some embodiments, a feed-forward stage $g_{mf}$ can be utilized to improve the slew-rate. In the compensation configuration of FIG. 1, the feedback of $C_{m1}$ can be implemented through cascode $g_{mc}$ which can also include an indirect compensation functionality. Some or all of the foregoing features can facilitate simplification of the amplification and/or the compensation circuit and also yield an improved frequency response.

Referring to the example compensation configuration of FIG. 1, a small signal open-loop transfer function can be expressed as follows. For simplification, assumptions can be made where $$g_{m1}R_1, g_{m2}R_2, g_{m3}R_3 \gg 1, \text{ and} \tag{1a}$$

$$C_L \gg C_{m1}, C_{m2}; \text{ and } C_{m1}, C_{m2} > C_1, C_2. \tag{1b}$$

In addition, $C_{m1}$ can be set to be equal to $C_{m2}$ to simplify computations. One can also assume that $R_t = 1/g_{mt}$, and $R_c = 1/g_{mc}$. Then, the transfer function can be expressed as $$F_{ol} = \frac{A_{DC}\left(1 + \frac{s}{z_0} + \frac{s^2}{z_0 z_1} + \frac{s^3}{z_0 z_1 z_2} + \frac{s^4}{z_0 z_1 z_2 z_3}\right)}{\left(1 + \frac{s}{\omega_0}\right)\left(1 + \frac{s}{\omega_1} + \frac{s^2}{\omega_1 \omega_2} + \frac{s^3}{\omega_1 \omega_2 \omega_3} + \frac{s^4}{\omega_1 \omega_2 \omega_3 \omega_4}\right)} \tag{2}$$

In Equation 2, terms of the denominator can be defined as $$\omega_0 = g_{m1}/C_{m1}, \omega_1 = g_{mt}/C_{m1}$$

$$\omega_2 = C_{m1}R_2 g_{m2} g_{m3}/(C_1 C_L)$$

$$\omega_3 = g_{mc}/C_{m1}, \omega_4 = 1/(R_2 C_2)$$

and the term $A_{DC}$ represents the DC gain which can be defined as $g_{m1}g_{m2}g_{m3}R_1R_2R_3$. It should be noted that the foregoing can be an estimation to generate stability conditions. In some implementations, more terms can be taken into account in design considerations. Examples of analysis of zeros are describe herein in greater detail.

In some embodiments, stability with large load capacitance can be addressed based on a unity-gain closed-loop configuration. Since the denominator's order is higher than that of the numerator, the stability will typically depend on the denominator of the closed-loop transfer function. By neglecting the zeros, the closed-loop transfer function can be expressed as $$F'_{cl} = \frac{1}{1 + \frac{s}{\omega_0} + \frac{s^2}{\omega_0 \omega_1} + \frac{s^3}{\omega_0 \omega_1 \omega_2} + \frac{s^4}{\omega_0 \omega_1 \omega_2 \omega_3} + \frac{s^5}{\omega_0 \omega_1 \omega_2 \omega_3 \omega_4}} \tag{3}$$

With Routh-Hurwitz stability criterion, the stability conditions can be obtained as $$\begin{cases} g_{mt} < g_{mc} \\ GBW = \frac{g_{m1}}{C_{m1}} < A_2 \frac{C_{m1}}{C_1} \frac{(g_{mc} - g_{mt})}{g_{mc}} \frac{g_{m3}}{C_L} \end{cases} \tag{4}$$

In Equation 4, $A_2$ is representative of the gain of the second stage. The first condition can be easy to meet since $g_{mt}$ and $g_{mc}$ are both under control. As for the second condition, the achievable GBW can be scaled by $A_2 C_{m1}(g_{mc} - g_{mt})/(C_1 g_{mc})$ which can increase the limitation to a large amount. However, because of process uncertainty in some implementations, a conservative value can be more preferable in some designs.

In some embodiments, no-load stability with and without $g_{mt}$-$C_{m2}$ loop can be characterized as follows. For the no-load situation, assumptions similar to those described above can be made, except that $C_L$, which mainly comes from the parasitic capacitance, is typically only several times larger than $C_2$. Accordingly, stable conditions by Routh-Hurwitz stability criterion can be expressed as in Equations 5 and 6 for configurations with and without the $g_{mt}$-$C_{m2}$ loop, respectively. In some situations, the condition associated with Equation 6 (without the $g_{mt}$-$C_{m2}$ loop) can be more difficult to be met because of the relatively small $C_2$ and $g_{mc}$ compared with $C_L$ and $g_{m2}$. Further, the stability can depend highly on parasitic parameters, and designs depending on such stability are typically not robust designs. If the $g_{mt}$-$C_{m2}$ loop is present, the stability can be improved by $C_{m2}$ which can be set to be the same as $C_{m1}$ for simple calculations.

$$\begin{cases} C_{m1}^2 g_{m3} > C_2(g_{mc} + g_{mt})(C_L + C_{m1}) \\ C_{m1}^2 g_{m2} g_{m3} g_{mc} > C_1 C_{m1} g_{m2} g_{m3} g_{mt} \rightarrow C_{m1} g_{mc} > C_1 g_{mt} \end{cases} \quad (5)$$

$$\begin{cases} \dfrac{C_2 g_{mc} g_{mf}(C_L + C_{m1})}{C_L C_{m1} g_{m2} g_{m3}} > 1 \\ \dfrac{C_L C_{m1} g_{m2} g_{m3}}{C_2(C_L + C_{m1}) g_{mc} g_{mf}} + \dfrac{4 C_1 g_{m1} g_{mc}^2 (C_L + C_{m1})}{C_{m1}^2 g_{mf}(g_{m1} + 2g_{mc})^2} < 1 \end{cases} \quad (6)$$

It will be understood that the foregoing example analysis in reference to Equations 5 and 6 is applicable for smaller $C_L$ compared with $C_{m1}$. For a load capacitance in between (e.g., a medium load capacitance), appropriate transfer functions can be obtained.

It is noted that with the some or all of the foregoing conditions described herein, stability can be achieved. Additional information such as phase margin can be obtained by including more small terms in the open-loop transfer function. With a large load capacitance, such a transfer function can be re-written as $$F_{ol} = \dfrac{A_{DC}\left(1 + \dfrac{s}{\omega_{ol1}}\right)\left(1 + \dfrac{s}{\omega_{ol4}}\right)\left(1 - \dfrac{s}{z_{c1}}\right)\left(1 - \dfrac{s}{z_{c2}}\right)}{\left(1 + \dfrac{s}{P_{-3dB}}\right)\left(1 + \dfrac{s}{\omega_{ol1}} + \dfrac{s^2}{\omega_{ol1}\omega_{ol4}}\right)\left(1 + \dfrac{s}{\omega_{ol2}} + \dfrac{s^2}{\omega_{ol2}\omega_{ol3}}\right)} \quad (7)$$

In Equation 7, $\omega_{ol1} = g_{mt}/C_{m1}$ $\omega_{ol2} = C_{m1} R_2 g_{m2} g_{m3}/(C_1 C_L)$ $\omega_{ol3} = g_{mc}/C_{m1}$ $\omega_{ol4} = 1/(R_2 C_2)$ $p_{-3 dB} = 1/(C_{m1} R_1 R_2 R_3 g_{m2} g_{m3})$ It is noted that $p_{-3 dB}$ is a dominant pole. With a very conservative estimation, one can have $$z_{c1,2} \approx \dfrac{C_{m1} R_1 g_{mf} \pm 2 C_{m1} R_1 g_{mf}}{2 C_1 C_{m1} R_1} = \dfrac{3 g_{mf}}{2 C_1} \text{ or } \dfrac{-g_{mf}}{2 C_1} \quad (8)$$

which can be set far away without affecting phase margin. In addition, as long as $\omega_{ol1}$ and $\omega_{ol4}$ are far from each other which is realizable, the two LHP zeros can cancel the real poles to thereby expand the GBW. Then the complex poles can eventually determine the phase margin. In such a situation, a design constraint can include $$PM \approx 90° - \tan^{-1}\left(\dfrac{\omega_{ol3} GBW}{\omega_{ol2}\omega_{ol3} - GBW^2}\right) > 60° \quad (9)$$

From the foregoing, one can obtain $$|p_{3,4}| = \sqrt{\dfrac{R_2 g_{m2} g_{m3} g_{mc}}{C_1 C_L}} > 2.8 \times GBW \quad (10)$$

To avoid gain peaking, damping factor can be set or estimated as $$\zeta = \sqrt{\dfrac{C_1 C_L g_{mc}}{4 C_{m1}^2 R_2 g_{m2} g_{m3}}} \geq 0.707 \quad (11)$$

Figure 2:
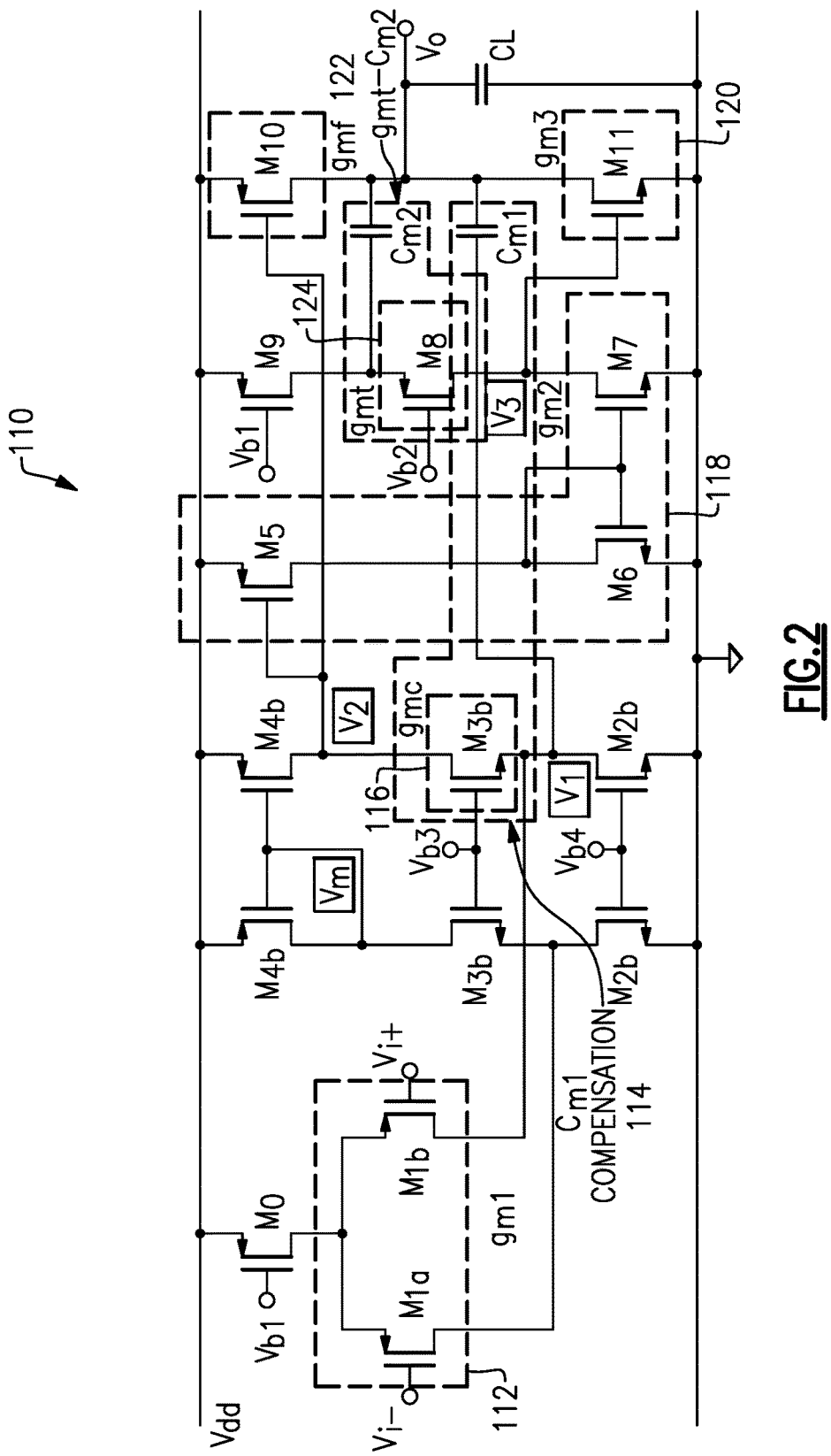
FIG. 2 shows a more detailed schematic of the example amplification system of FIG. 1.

FIG. 2 shows a more detailed schematic of the example amplification system 100 of FIG. 1. In FIG. 2, such an amplification system is depicted as a three stage amplification system 110. The three stages can generally include dashed portions indicated as $g_{m1}$, $g_{m2}$, and $g_{m3}$. In the example of FIG. 2, $C_{m1}$ compensation and $g_{mt}$-$C_{m2}$ loop as described herein can include dashed portions indicated as 114 and 122, respectively.

In some embodiments, the three stage amplifier of FIG. 2 can be implemented in, for example, a 0.6 μm CMOS process. Each of the capacitances $C_{m1}$ and $C_{m2}$ can have a value of, for example, approximately 1 pF.

In some embodiments, the first stage can be implemented with a differential input single-ended folded cascode. The second stage can include a common source with a current mirror. The third stage can be implemented as a class-AB stage to, for example, improve slew-rate performance.

Examples of DC gains and phase margins at different corners for the example configuration of FIG. 1 are shown in Table 1.

TABLE 1

| Corner | | T | SS | FF | FS | SF |
|---|---|---|---|---|---|---|
| −40° | DCGain (dB) | 105.5 | 105.1 | 105.6 | 105.1 | 106.6 |
| | PM (°) | 70.25 | 78.67 | 50.35 | 69.86 | 70.85 |
| 27° | DCGain (dB) | 102.7 | 102.4 | 102.6 | 102.3 | 103.1 |
| | PM (°) | 67.46 | 76.37 | 51.64 | 67.03 | 68.09 |
| 105° | DCGain (dB) | 100.7 | 100.5 | 100.4 | 100.4 | 101.1 |
| | PM (°) | 65.35 | 74.66 | 50.25 | 64.87 | 65.99 |

Referring to Table 1, it is noted that the phase margin (PM) can be kept above 50° at all of the corners.

Figure 3:
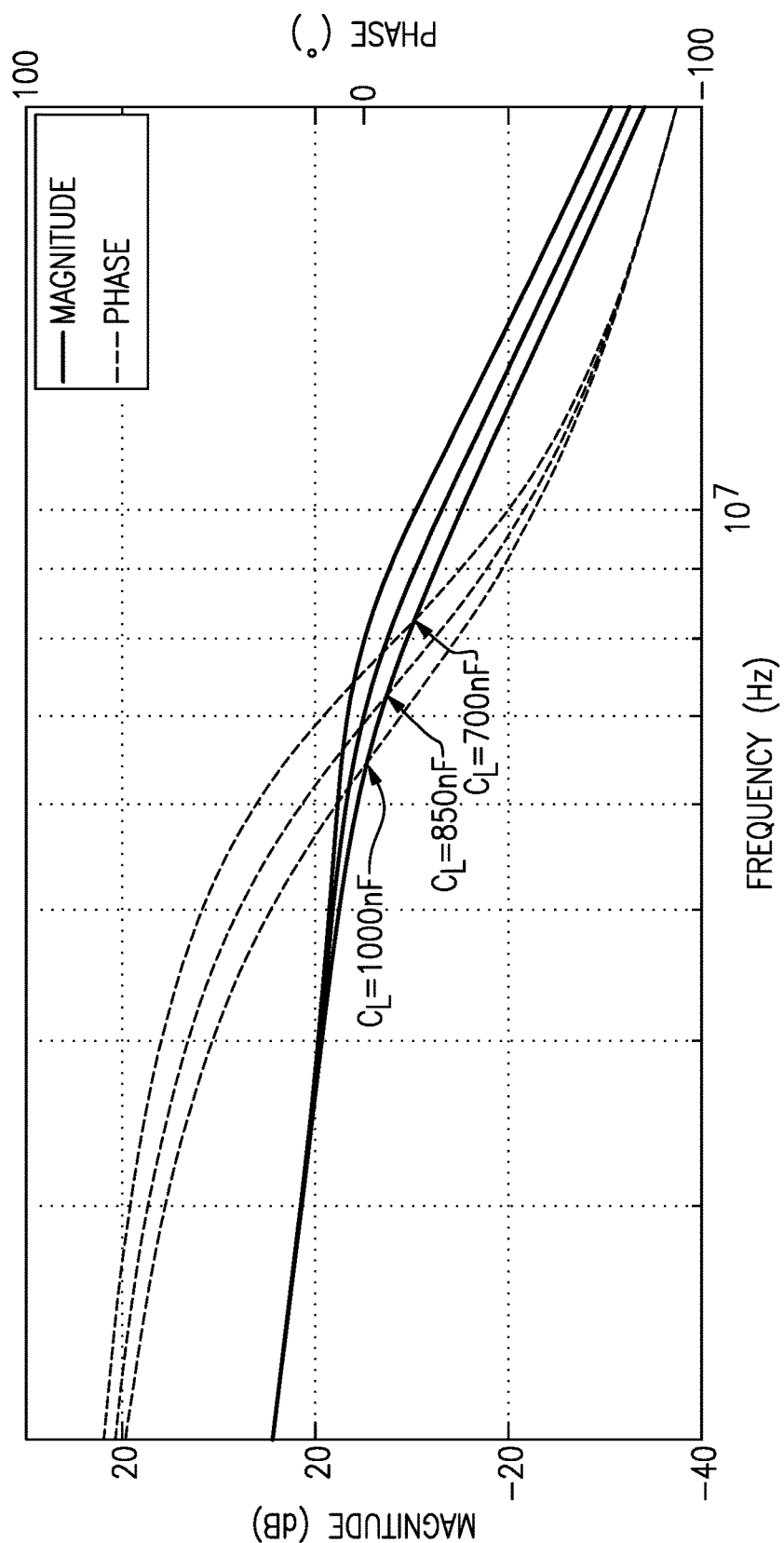
FIG. 3 shows examples of responses of transfer functions related to the compensation circuit of FIGS. 1 and 2.

FIG. 3 shows examples of responses of transfer functions for the worst case example of Table 1 (phase margin at the FF corner (50.25) at 105°), relative to a unity gain frequency (UGF). The three sets of curves correspond to different load capacitances (e.g., $C_L$=1,000 nF, 850 nF, 700 nF). It is noted that the phase margin becomes better with smaller load, consistent with the example of Equation 9.

Examples of parameters of the amplifier at the foregoing FF corner are shown in Table 2, and examples of specifications are shown in Table 3.

TABLE 2

| | Parameter | | | | | | |
|---|---|---|---|---|---|---|---|
| | $g_{m1}$ (μS) | $g_{m2}$ (μS) | $g_{m3}$ (μS) | $g_{mc}$ (μS) | $g_{mt}$ (μS) | $g_{mf}$ (μS) | $C_L$ (nF) |
| Value | 21 | 212 | 390 | 92.6 | 84 | 319 | 1 |

| | Parameter | | | | | |
|---|---|---|---|---|---|---|
| | $C_1$ (fF) | $C_2$ (fF) | $C_{m1}$ (pF) | $R_1$ (MΩ) | $R_2$ (KΩ) | $R_3$ (KΩ) |
| Value | 418 | 65.5 | 1 | 3.15 | 190 | 104 |

TABLE 3

| Specifications | Calculations | Simulations |
|---|---|---|
| DC Gain (dB) | 100.6 | 100.4 |
| 3 dB Bandwidth (Hz) | 31 | 30.43 |
| GBW (MHz) | 3.34 | 3.596 |
| PM (°) | 57 | 50.65 |

Referring to the examples of Table 3, it can be seen that the calculation and simulation results are close to each other.

An example configuration without an external load was also simulated, and the corresponding closed-loop pole locations are shown in Table 4.

TABLE 4

| Case | P1 (MHz) | P2 (MHz) | P3 (MHz) | P4 (MHz) |
|---|---|---|---|---|
| With Loop | −3.0 | −15.8 | −41.8 | −51.8 ± 210.3i |
| No Loop | −3.0 | −18.1 | 55.8 ± 150.8i | −226.4 |

In Table 4, the example pole locations are shows for configurations with and without the $g_{mt}$-$C_{m2}$ loop as described herein. One can see that in the configuration without the $g_{mt}$-$C_{m2}$ loop, the RHP poles degrade or destroy the stability performance.

Figure 4:
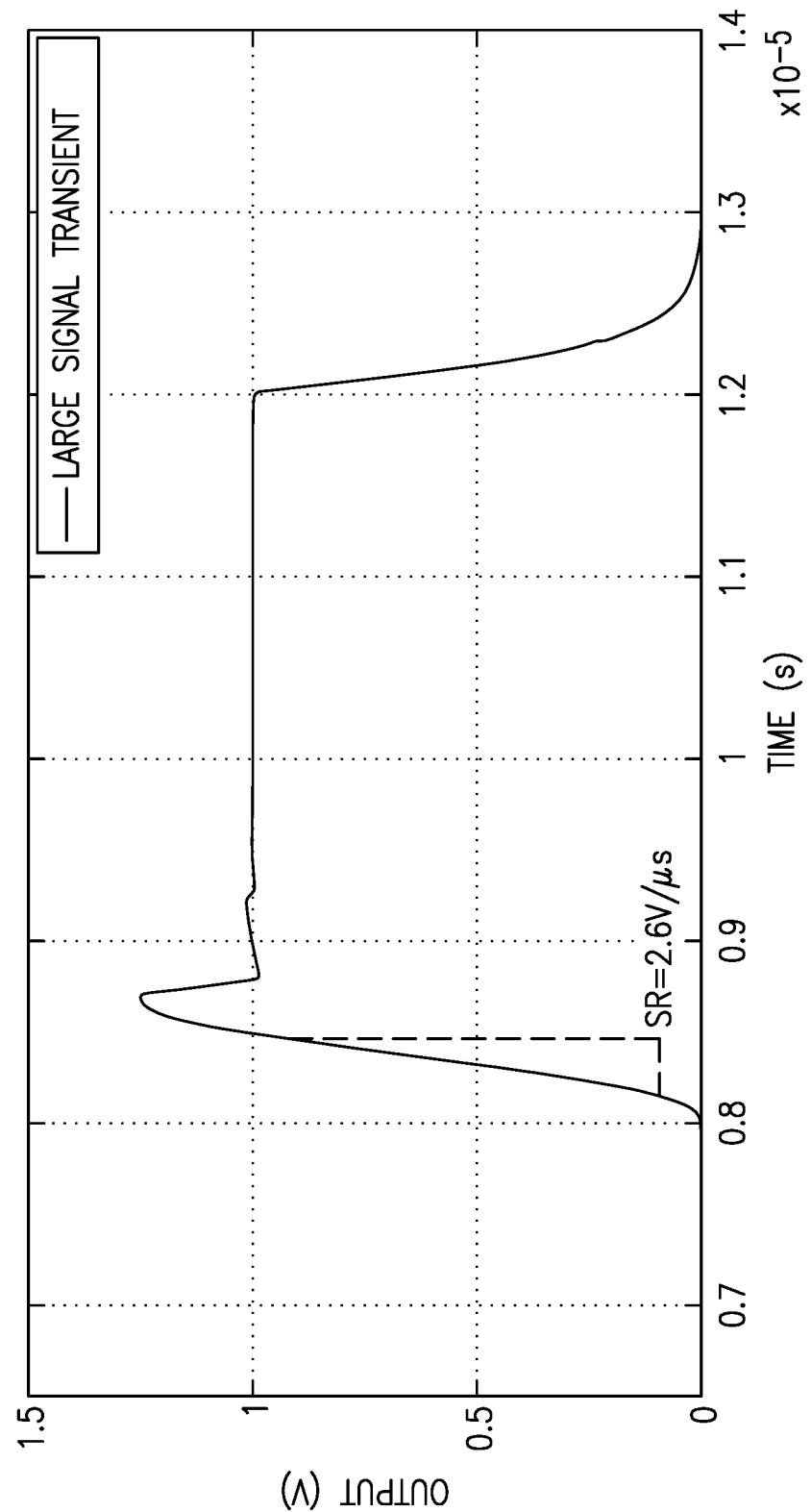
FIG. 4 shows an example of large signal performance for the example amplification system of FIGS. 1 and 2.

FIG. 4 shows an example of large signal performance for the example amplifier of FIG. 2. As shown, the slew rate can be as high as 2.6V/μs, and such a slew rate can allow the amplifier design to drive larger load capacitance with more slew rate and improving the $IFOM_L$ performance.

As described herein, one or more features of a frequency compensation technique can provide effective compensation of amplification topology for both large capacitive load and no-load configurations. As also described herein, two example LHP zeros can help cancel or reduce the effect of two real poles, and with such complex poles' expression, designs for multistage amplifiers can be improved. Further, and as described herein, such a technique can stabilize and enlarge bandwidth associated with a multistage amplifier. In the example where the output stage is a class-AB amplification stage, one or more features of the present disclosure can allow driving of the output with relatively large slew rate in a multistage amplifier implemented in, for example, 0.6 μm CMOS technology.

Figure 5:
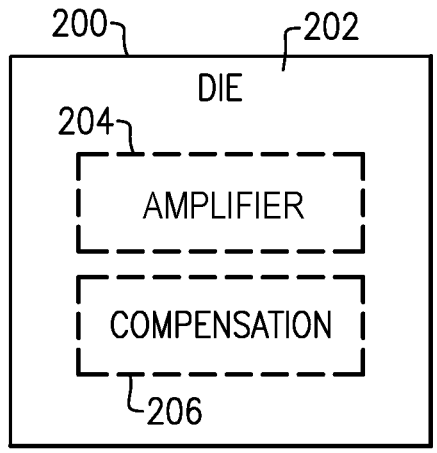
FIG. 5 shows that in some embodiments, one or more features of the present disclosure can be implemented on a semiconductor die.

FIG. 5 shows that in some embodiments, a multistage amplifier 204 having one or more features as described herein can be implemented in a semiconductor die 200. Such a die can include a substrate 202 configured to allow, for example, CMOS processes for formation of the multistage amplifier 204.

In the example of FIG. 5, the multistage amplifier 204 can be implemented as, for example, an operational amplifier having one or more features as described herein. It will be understood that one or more features of the present disclosure can also be implemented in other types of amplifiers. The die 202 can also include some or all of a compensation circuit 206 having one or more features as described herein.

Figure 6:
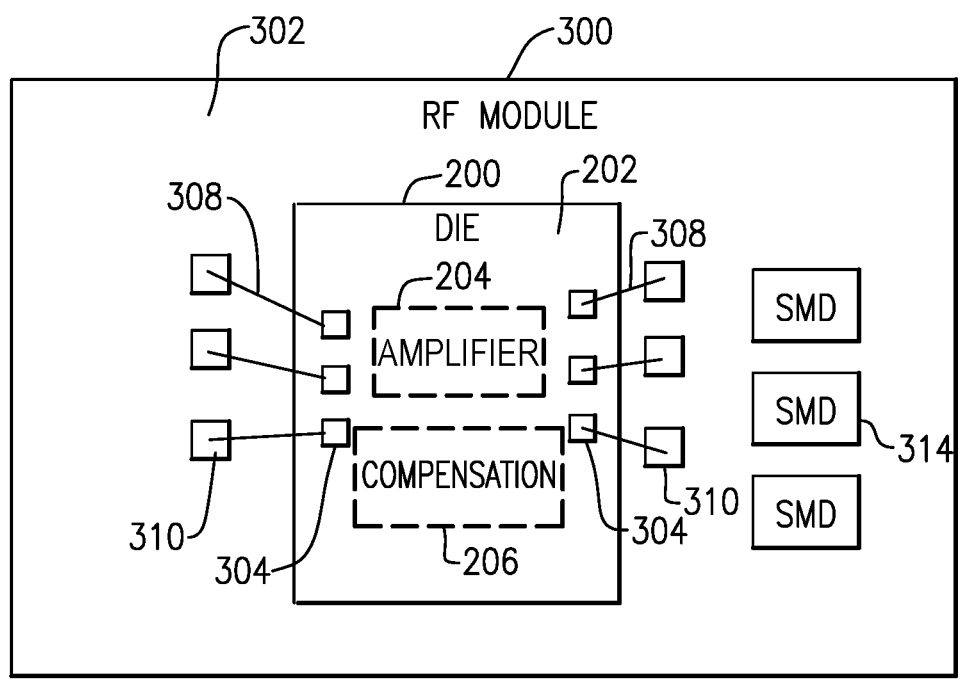
FIG. 6 shows that in some embodiments, one or more features of the present disclosure can be implemented on a packaged module such as a radio-frequency (RF) module.

In some implementations, one or more features described herein can be included in a module. FIG. 6 depicts an example radio-frequency (RF) module 300 having a packaging substrate 302 that is configured to receive a plurality of components. In some embodiments, such components can include a die 200 having one or more features as described herein. For example, the die 200 can include a semiconductor die 202 such as the example of FIG. 5. A plurality of connection pads 304 can facilitate electrical connections such as wirebonds 308 to connection pads 310 on the packaging substrate 302 to facilitate passing of various power and signals to and from the die 200.

In some embodiments, other components can be mounted on or formed on the packaging substrate 302. For example, one or more surface mount devices (SMDs) (314) can be implemented. In some embodiments, the packaging substrate 302 can include a laminate substrate.

In some embodiments, the module 300 can also include one or more packaging structures to, for example, provide protection and facilitate easier handling of the module 300. Such a packaging structure can include an overmold formed over the packaging substrate 302 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

In some embodiments, the RF module 300 of FIG. 6 can be, for example, a power amplifier module, a front-end module, a low-noise amplifier module, a transceiver module, a power management module, or any module configured to provide amplification functionality such as op-amp functionality. It will be understood that one or more features of the present disclosure can also be implemented in other types of modules.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 7:
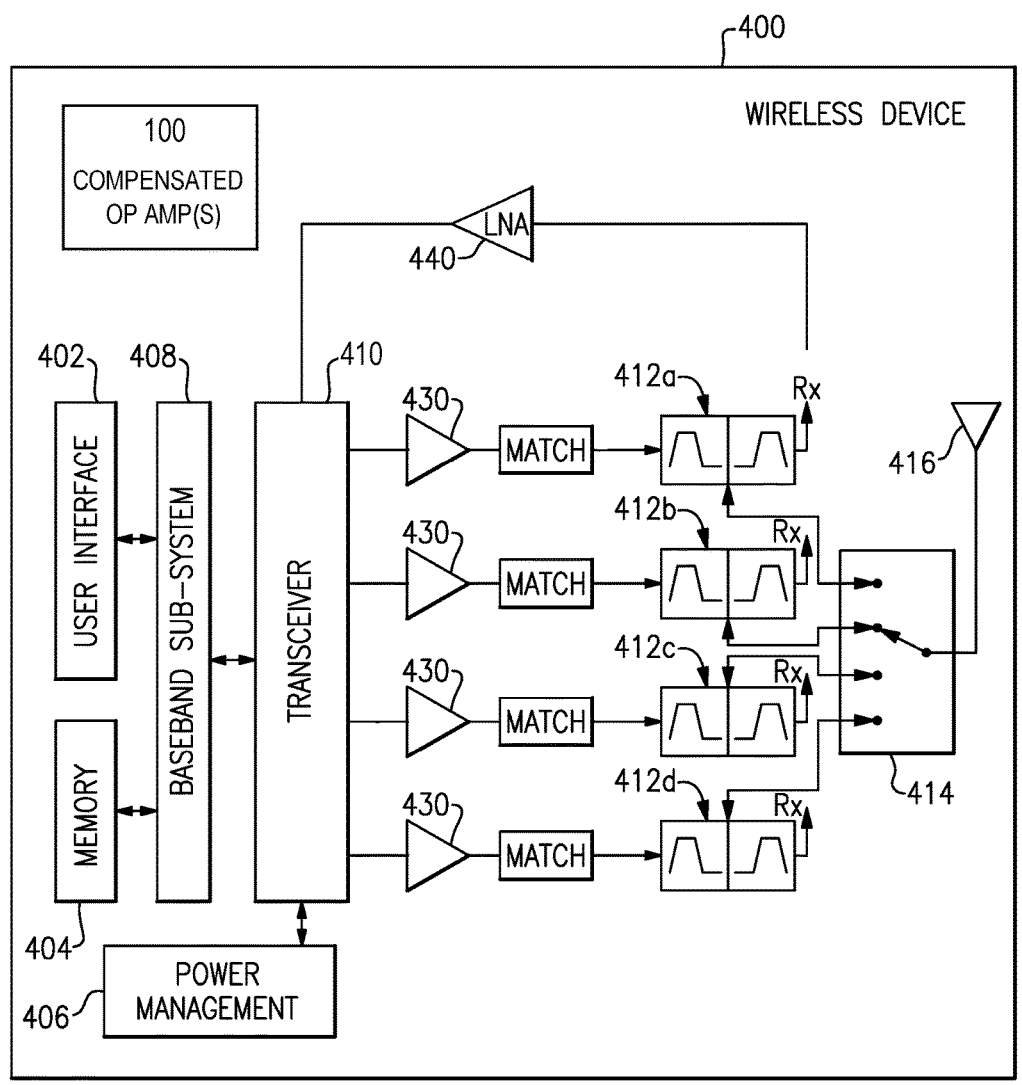
FIG. 7 shows that in some embodiments, one or more features of the present disclosure can be implemented in an electronic device such as a wireless device.

FIG. 7 shows that one or more compensated amplifiers 100 (e.g., compensated operational amplifier(s)) having one or more features as described herein can be included in a wireless device 400. In some embodiments, such compensated amplifier(s) can include one or more compensation circuits as described herein. Such compensated amplifier(s) can be utilized in various parts of the wireless device 400, including some or all of the various components described herein.

In the example of FIG. 7, the wireless device 400 can also include a transceiver 410 for generating an RF signal to be amplified by one or more power amplifiers 430 and transmitted through an antenna 416, and for processing a received RF signal received through the antenna 520 and amplified by an LNA 440.

In the example of FIG. 7, the amplifiers 430 can receive their respective RF signal(s) from the transceiver 410. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the amplifiers 430 are shown to be matched and routed to an antenna 416 via their respective duplexers 412a-412d and a band-selection switch 414. The band-selection switch 414 can be configured to allow selection of, for example, an operating band or an operating mode. In some embodiments, each duplexer 412 can allow transmit and receive operations to be performed simultaneously using a common antenna (e.g., 416). In FIG. 7, received signals are shown to be routed to "Rx" paths that can include, for example, the LNA 440.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An amplifier comprising:
   a first stage, a second stage, and a third stage implemented in series between an input node and an output node;
   a feed-forward element implemented between an input of the second stage and an output of the third stage;
   a first feedback path implemented between the output of the third stage and a node between the first and second stages, the first feedback including a first capacitance; and
   a second feedback path implemented between the output of the third stage and an output of the second stage, the second feedback path including a transconductance element and a second capacitance arranged in series.

2. The amplifier of claim 1 further comprising a cascode transistor implemented between an output of the first stage and the input of the second stage.

3. The amplifier of claim 2 wherein the first feedback path includes the cascode transistor such that the first feedback path couples the output of the third stage with the input of the second stage.

4. The amplifier of claim 3 wherein the cascode transistor includes a source connected to the output of the first stage, and a drain connected to the input of the second stage.

5. The amplifier of claim 1 wherein the feed-forward element includes a field-effect transistor having a gate connected to the input of the second stage and a drain connected to the output of the third stage.

6. The amplifier of claim 1 wherein the third stage includes a field-effect transistor having a drain connected to the output of the third stage and a gate connected to an input of the third stage.

7. The amplifier of claim 6 wherein the input of the third stage is directly connected to the output of the second stage.

8. The amplifier of claim 6 wherein the second feedback path is configured such that a first terminal of the second capacitance is connected to the drain of the field-effect transistor of the third stage, and a second terminal of the second capacitance is connected to the transconductance element of the second feedback path.

9. The amplifier of claim 8 wherein the transconductance element of the second feedback path includes a field-effect transistor having a source connected to the second terminal of the second capacitance, and a drain connected to the output of the second stage.

10. The amplifier of claim 1 wherein each of the first stage, the second stage, and the third stage includes one or more field-effect transistors.

11. The amplifier of claim 10 wherein substantially all of the field-effect transistors are implemented as CMOS devices.

12. The amplifier of claim 1 wherein the amplifier is configured as an operational-amplifier.

13. The amplifier of claim 12 wherein the operational-amplifier is configured to process a signal having a frequency within a radio-frequency (RF) range.

14. A semiconductor die comprising:
   a semiconductor substrate; and
   an amplifier circuit implemented on the semiconductor substrate, the amplifier circuit including a first stage, a second stage, and a third stage implemented in series between an input node and an output node, the amplifier circuit further including a feed-forward element implemented between an input of the second stage and an output of the third stage, the amplifier circuit further including a first feedback path implemented between the output of the third stage and a node between the first and second stages, the first feedback including a first capacitance, the amplifier circuit further including a second feedback path implemented between the output of the third stage and an output of the second stage, the second feedback path including a transconductance element and a second capacitance arranged in series.

15. The semiconductor die of claim 14 wherein each of the first stage, the second stage, and the third stage includes one or more field-effect transistors.

16. The semiconductor die of claim 15 wherein the semiconductor substrate is configured to allow formation of the field-effect transistors as CMOS devices.

17. The semiconductor die of claim 14 wherein the amplifier circuit is configured as an operational-amplifier.

18. The semiconductor die of claim 17 further comprising an integrated circuit configured to process one or more signals, the integrated circuit coupled to and configured to utilize the operational-amplifier.

19. A packaged electronic module comprising:
a packaging substrate configured to receive a plurality of components; and
a semiconductor die mounted on the packaging substrate and including an amplifier circuit having a first stage, a second stage, and a third stage implemented in series between an input node and an output node, the amplifier circuit further including a feed-forward element implemented between an input of the second stage and an output of the third stage, the amplifier circuit further including a first feedback path implemented between the output of the third stage and a node between the first and second stages, the first feedback including a first capacitance, the amplifier circuit further including a second feedback path implemented between the output of the third stage and an output of the second stage, the second feedback path including a transconductance element and a second capacitance arranged in series.

* * * * *